(12) United States Patent
Yoon (10) Patent No.: US 7,839,196 B2
(45) Date of Patent: Nov. 23, 2010

(54) MULTI-PHASE CLOCK GENERATION CIRCUIT HAVING A LOW SKEW IMPRECISION

(75) Inventor: Dae Kun Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 24 days.

(21) Appl. No.: 12/342,778

(22) Filed: Dec. 23, 2008

(65) Prior Publication Data

US 2010/0117692 A1    May 13, 2010

(30) Foreign Application Priority Data

Nov. 11, 2008    (KR) .................. 10-2008-0111407

(51) Int. Cl.
*H03K 5/13* (2006.01)
(52) U.S. Cl. ...................... 327/231; 327/237
(58) Field of Classification Search .................. None
See application file for complete search history.

(56) References Cited

U.S. PATENT DOCUMENTS

| | | | |
|---|---|---|---|
| 6,570,425 B2 * | 5/2003 | Yamaguchi ............. | 327/251 |
| 6,794,912 B2 | 9/2004 | Hirata et al. | |
| 6,977,539 B1 * | 12/2005 | McDonagh et al. ......... | 327/295 |
| 7,446,616 B2 | 11/2008 | Lee | |
| 2005/0053180 A1 * | 3/2005 | Nose et al. .................. | 375/354 |
| 2006/0098823 A1 * | 5/2006 | Venes et al. ................. | 380/219 |
| 2007/0047680 A1 * | 3/2007 | Okamura .................... | 375/348 |
| 2007/0047686 A1 * | 3/2007 | Aoki et al. .................. | 375/374 |
| 2008/0094109 A1 * | 4/2008 | Farjad-rad et al. ........... | 327/99 |
| 2008/0100364 A1 | 5/2008 | Hiraku | |

* cited by examiner

*Primary Examiner*—Cassandra Cox
(74) *Attorney, Agent, or Firm*—Ladas & Parry (57) ABSTRACT

A multi-phase clock generation circuit having a low skew imprecision is presented. The circuit includes a phase clock generation block and a phase correction block. The phase clock generation block is configured to generate a plurality of phase clocks having phases different from each other with response to a pair of input clocks. The phase correction block is configured to generate final output interpolated phase clocks in which each has a center phase by adjusted by multiple phase clocks that have adjacent phases.

12 Claims, 6 Drawing Sheets

MULTI-PHASE CLOCK GENERATION CIRCUIT HAVING A LOW SKEW IMPRECISION

CROSS-REFERENCES TO RELATED APPLICATION

The present application claims priority under 35 U.S.C. 119(a) to Korean application number 10-2008-0111407, filed on Nov. 11, 2008, in the Korean Patent Office, which is incorporated by reference in its entirety as if set forth in full.

BACKGROUND OF THE INVENTION

1. Technical Field

The embodiments described herein relate to a clock generation circuit, and more particularly, to a multi-phase clock generation circuit.

2. Related Art

As memory system technologies are developed and as they advance forward, corresponding techniques for processing data at higher speeds are also needed. That is, techniques for transferring data at higher rates are needed to match those advances in memory system technologies. In order to process serial data at a high data transfer rate with a high-bandwidth, a pre-fetch scheme is employed in a semiconductor memory apparatus.

The pre-fetch scheme latches data input in series to process the data in parallel. In order to perform this type of pre-fetch scheme, a semiconductor memory apparatus must use clocks having different phases.

As generally known to those skilled in the art, a phase locked loop (PLL) is used to generate clocks having different phases, that is, multiple phase clocks. Unfortunately, this type of PLL circuit occupies a large area and consumes a great deal of current. Accordingly, this type of PLL circuit is mostly restricted to use in lower-power-operations. For this reason, recently, a phase interpolator has been mainly used which receives two clock signals to generate a clock obtained by interpolating a phase difference between the two clock signals.

In detail, the phase interpolator generates a new clock signal having a center phase between two input clock signals. Unfortunately, as the frequency of the clock signals have been steadily increasing, it is becoming more and more difficult to generate an appropriate clock signal that exhibits an exact phase. Accordingly, a phase offset may occur in each clock having a multi-phase which ends up in allowing a phase error to occur. As a result of a phase error, valid data section may be compromised, when data are transmitted in synchronization with the multi-phase clock that exhibits this type of phase error.

SUMMARY

A multi-phase clock generation circuit capable of correcting a phase error is described herein.

According to one aspect, a multi-phase clock generation circuit includes a phase clock generation block configured to generate a plurality of phase clocks having phases different from each other in response to a pair of clocks, and a phase correction block configured to generate interpolated phase clocks having a center phase between the adjacent multi-phase clocks, as multi-phase clocks.

According to another aspect, a multi-phase clock generation circuit includes a phase clock generation block configured to generate 4n (where n is an integer exceeding 2) phase clocks having different phases in response to n clock signals having phases inverted to each other, and a phase correction block configured to generate 4n multiple phase clocks by repeatedly generating interpolated phase clocks m times (where m is a natural number) based on clocks, which have phase differences adjacent to each other, among the 4n phase clocks.

According to still another aspect, a multi-phase clock generation circuit includes a first phase clock generation block configured to generate quad clocks having different phases in response to a first pair of clocks having phases inverted to each other, a second phase clock generation block configured to generate octal clocks having different phases in response to the quad clocks, and a phase correction block configured to generate multiple phase clocks having a number identical to a number of the octal clocks by generating interpolated phase clocks m (m is a natural number) times, the interpolated phase clocks having a center phase based on clocks, which have adjacent phases, among the octal clocks.

As described above, according to one embodiment of the present invention, when clocks having multiple phases are generated, clocks having a center phase between adjacent clocks are repeatedly generated several times or more, a phase error can be corrected between clocks. Accordingly, multiple phase clocks are generated by correcting phases, so that data quality and transmission efficiency can be improved.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
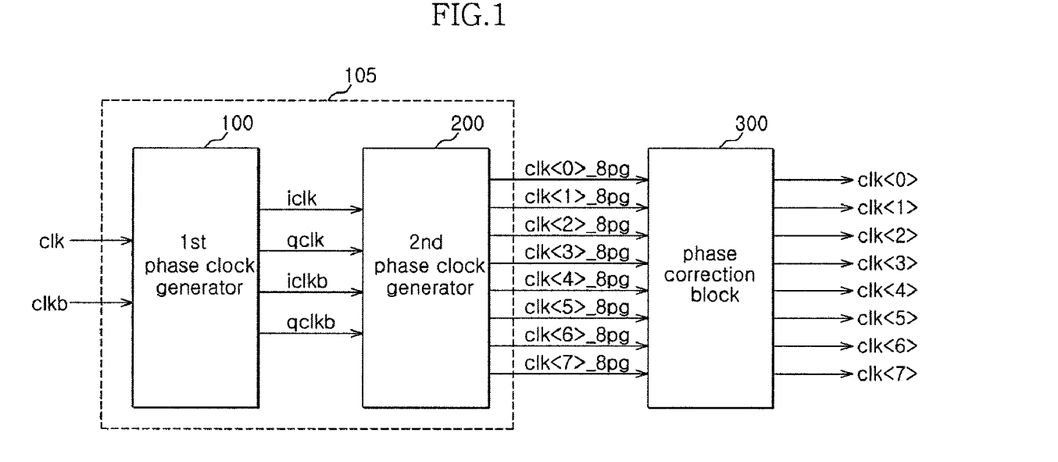
FIG. 1 is a block diagram showing a multi-phase clock generation circuit according to one embodiment of the present invention.

FIG. 1 is a block diagram showing a multi-phase clock generation circuit that generates 8-phase clocks according to one of the embodiments of the present invention.

Referring to FIG. 1, the multi-phase clock generation circuit includes a phase clock generation block 105 and a phase correction block 300.

The phase clock generation block 105 generates a plurality of octal clocks 'clk<0>_8pg' to 'clk<7>_8pg' having different phases in response to a pair of clocks 'clk' and 'clkb'. The phase clock generation block 105 includes a first phase clock generator 100 and a second phase clock generator 200.

The first phase clock generator 100 receives the pair of clocks 'clk' and 'clkb' to generate quad clocks 'iclk', 'iclkb', 'qclk' and 'qclkb' representing four different phases. First and second clocks 'iclk' and 'iclkb', and third and fourth clocks 'qclk' and 'qclkb' of the quad clocks 'iclk', 'iclkb', 'qclk' and 'qclkb' have phase difference of n (180°). However, the first and third clocks 'iclk' and 'qclk' have a phase interval of $\pi/2$ (90°) therebetween, and the second and fourth clocks 'iclkb' and 'qclkb' have phase difference $\pi/2$ (90°) therebetween.

The second phase clock generator 200 receives the quad clocks 'iclk', 'iclkb', 'qclk' and 'qclkb' to generate octal clocks 'clk<0>_8pg' to 'clk<7>_8pg' representing eight different phases. The octal clocks 'clk<0>_8pg' to 'clk<7>_8pg' are maintained with phase difference of n/4 (450°). For example, first to eighth clocks of the octal clocks 'clk<0>_8pg' to 'clk<7>_8pg' may have phases of 0°, 45°, 90°, 135°, 180°, 225°, 270°, and 315°, respectively.

The phase correction block 300 according to the present invention receives the octal clocks 'clk<0>_8pg' to 'clk<7>_8pg' to generate multiple phase clocks 'clk<0>' to 'clk<7>' obtained by correcting phases.

The phase correction block 300 generates clocks having center phases of the octal clocks 'clk<0>_8pg' to 'clk<7>_8pg' through a phase interpolation scheme. In detail, the phase correction block 300 includes a plurality of phase interpolators (not shown), and controls the octal clocks 'clk<0>_8pg' to 'clk<7>_8pg' to pass through the phase interpolators (not shown), so that a phase error range between clocks can be reduced. Accordingly, phase errors of the multiple phase clocks 'clk<0>' to 'clk<7>', which are output in a final stage, are corrected, so that the multiple phase clocks 'clk<0>' to 'clk<7>' having a constant phase difference can be generated. Details thereof will be described later.

Figure 2:
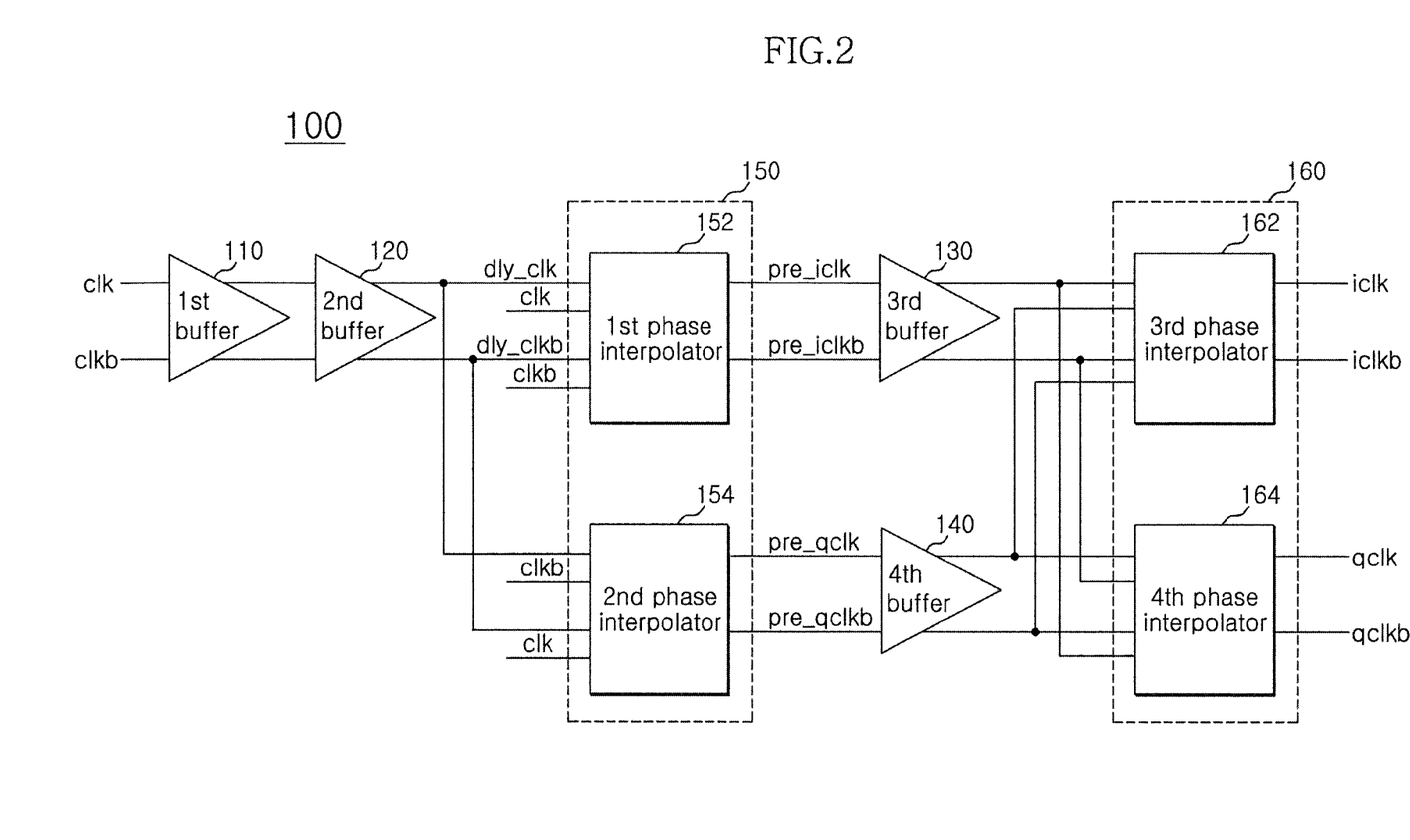
FIG. 2 is a block diagram showing a first phase clock generator shown in FIG. 1.

FIG. 2 is a block diagram showing the first phase clock generator 100 shown in FIG. 1.

Referring to FIG. 2, the first phase clock generator 100 includes first to fourth buffers 110 to 140, a first phase interpolation unit 150, and a second phase interpolation unit 160.

The first and second buffers 110 to 120 delay the pair of clocks 'clk' and 'clkb' by a predetermined time to generate a pair of delayed clocks 'dly_clk' and 'dly_clkb'.

The first phase interpolation unit 150 generates four clocks 'pre-iclk', 'pre-iclkb', 'pre-qclk' and 'pre-qclkb' that are phase-interpolated by using the pair of clocks 'clk' and 'clkb' and the pair of the delayed clocks 'dly_clk' and 'dly_clkb'. The first phase interpolation unit 150 includes a first phase interpolator 152 and a second phase interpolator 154.

The first phase interpolator 152 receives the delayed positive clock 'dly_clk' and the positive clock 'clk' to generate a clock signal that is phase-interpolated between the delayed positive clock 'dly_clk' and the positive clock 'clk'. The first phase interpolator 152 receives the delayed negative clock 'dly_clkb' and the negative clock 'clkb' to generate a clock signal that is phase-interpolated between the delayed negative clock 'dly_clkb' and the negative clock 'clkb'. In other words, the first phase interpolator 152 generates first and second preliminary clocks 'pre-iclk' and 'pre-iclkb' having a center phase of phases of two input signals.

Similarly, the second phase interpolator 154 receives the delayed positive clock 'dly_clk' and the negative clock 'clkb' to generate a clock signal that is phase-interpolated between the delayed positive clock 'dly_clk' and the negative clock 'clkb'. The second phase interpolator 154 receives the delayed negative clock 'dly_clkb' and the positive clock 'clk' to generate a clock signal that is phase-interpolated between the delayed negative clock 'dly_clkb' and the positive clock 'clk'. Accordingly, the second phase interpolator 154 generates third and fourth preliminary clocks 'pre-qclk' and 'pre-qclkb' having a center phase of phases of two input signals.

The output signals of the first and second phase interpolators 152 and 154 are buffered through the third and fourth buffers 130 and 140.

The first phase clock generator 100 further includes the second phase interpolation unit 160. The second phase interpolation unit 160 further includes third and fourth phase interpolators 162 and 164. The third and fourth phase interpolators 162 and 164 generate phase-interpolated clocks for the output signals of the third and fourth buffers 130 and 140. In other words, the third and fourth phase interpolators 162 and 164 generate the quad clocks 'iclk', 'iclkb', 'qclk' and 'qclkb' having center phases between phases of the output signals 'pre-iclk', 'pre-iclkb', 'pre-qclk' and 'pre-qclkb' of the first and second phase interpolators 152 and 154.

In detail, the third phase interpolator 162 generates the first quad clock 'iclk' by using the first and third preliminary clocks 'pre-iclk' and 'pre-qclk' that have passed through the third and fourth buffers 130 and 140. In addition, the third phase interpolator 162 generates the second quad clock 'iclkb' by using the second and fourth preliminary clocks 'pre-iclkb' and 'pre-qclkb' that have passed through the third and fourth buffers 130 and 140.

Similarly, the fourth phase interpolator 164 generates the third quad clock 'qclk' by using the second and third preliminary clocks 'pre-iclkb' and 'pre-qclkb' that have passed through the third and fourth buffers 130 and 140. In addition, the fourth phase interpolator 164 generates the fourth quad clock 'qclkb' by using the first and fourth preliminary clocks 'pre-iclk' and 'pre-qclkb' that have passed through the third and fourth buffers 130 and 140. The quad clocks 'iclk', 'iclkb', 'qclk' and 'qclkb' have phases of 0°, 185°, 90°, and 270°, respectively.

The second phase interpolation unit 160 generates signals having center phases based on the output signals of the third and fourth buffers 130 and 140, so that a phase error can be corrected. In other words, the third and fourth phase interpolators 162 and 164 generate signals having center phases based on two input signals so that a phase error can be gradually reduced while performing the phase interpolation scheme.

In detail, when it is assumed that the quad clocks 'iclk', 'iclkb', 'qclk' and 'qclkb' maintained with phase differences of 90° between two adjacent clocks are generated, a clock skew may occur in accordance to the clock frequencies. Accordingly, a specific clock among the quad clocks 'iclk', 'iclkb', 'qclk' and 'qclkb' may have phase difference of θ.

In other words, on an assumption that the first preliminary clock 'pre-iclk' has a phase of 0°, the third preliminary clock 'pre-qclk' has a phase of 90°+θ, the second preliminary clock 'pre-iclkb' has a phase of 180°, and the fourth preliminary clock 'pre-qclkb' has a phase of 270°, the first preliminary clock 'pre-iclk' and the third preliminary clock 'pre-qclk' that are adjacent to each other have a phase difference of 90°+θ.

In addition, the third preliminary clock 'pre-qclk' and the second preliminary clock 'pre-iclkb' have phase difference of 90°−θ. Accordingly, since the phase difference of 90° is not made between adjacent clocks, data may not be transmitted.

Hereinafter, description will be made regarding the generation of an interpolated phase clock through the repeated phase interpolation scheme when the phase difference is distorted.

When the first preliminary clock 'pre-iclk' has a phase of 0°, and the third preliminary clock 'pre-qclk' has a phase of 90°+θ, a phase of a clock that is phase-interpolated between the two preliminary clocks 'pre-iclk' and 'pre-qclk' may be expressed as following equation 1.

$$((90°+\theta)-0°)/2+0=45°+\theta/2 \quad \text{(Equation 1)}$$

Where equation 1 corresponds to the new first preliminary clock.

A phase of a phase-interpolated clock between the first and third preliminary clocks 'pre-iclk' and 'pre-qclk' may be expressed as following equation 2.

$$(180°-(90°+\theta))/2+(90°+\theta)=135°+\theta/2 \quad \text{(Equation 2)}$$

Wherein equation 2 corresponds to a new second preliminary clock.

If a phase-interpolated clock is generated through a phase interpolation scheme, the new first and second preliminary clocks have a phase difference of 90°+θ/2 therebetween. In other words, whenever a new phase clock is generated through the phase interpolation scheme, an error range of phase difference can be reduced by ½.

The second phase interpolation unit 160 of the first phase clock generator 100 is only an example on how to generate a corrected phase clock, and the objects or the scope of the present disclosure are not limited thereto. Accordingly, the second phase interpolation unit 160 can be removed from the first phase clock generator 100 according to a circuit structure. In other words, it can be recognized that the first phase clock generator 100 can output the output signals of the third and fourth buffers 130 and 140 as the quad clocks 'iclk', 'iclkb', 'qclk' and 'qclkb'. As described above, since the second phase interpolation unit 160 is not for generating additional phase clocks, but rather for performing the phase correction, so that the second phase interpolation unit 160 generates a clock having a center phase only between adjacent clocks to perform phase correction.

In addition, according to one embodiment of the present invention, although the first phase clock generator 100 uses the pair of clocks 'clk' and 'clkb' and the pair of the delayed clocks 'dly_clk' and 'dly_clkb', the first phase clock generator 100 may generate the quad clocks 'iclk', 'iclkb', 'qclk' and 'qclkb' only by using the pair of clocks 'clk' and 'clkb'. However, according to one embodiment of the present invention, since the pair of clocks 'clk' and 'clkb' has large phase difference therebetween, the pair of clocks 'clk' and 'clkb' and the pair of the delayed clocks 'dly_clk' and 'dly_clkb' delayed from the pair of clocks 'clk' and 'clkb' are used to reduce a phase offset or a phase error range of the quad clocks 'iclk', 'iclkb', 'qclk' and 'qclkb'.

As described above, the first phase clock generator 100 generates the quad clocks 'iclk', 'iclkb', 'qclk' and 'qclkb' representing 4-phase clocks by using the pair of clocks 'clk' and 'clkb'.

Figure 3:
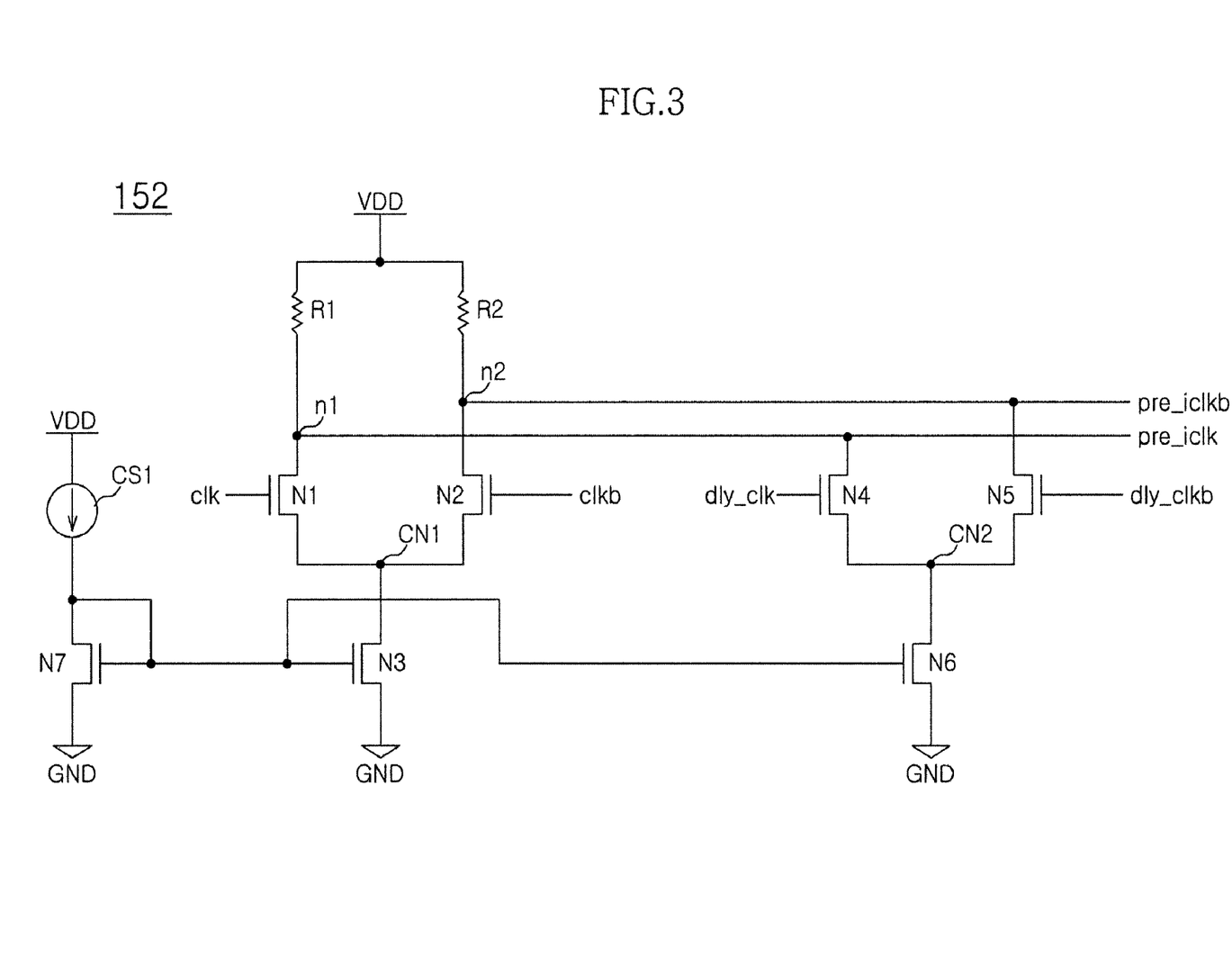
FIG. 3 is a circuit diagram showing a first phase interpolator shown in FIG. 2.

FIG. 3 is a circuit diagram showing the first phase interpolator 152 shown in FIG. 2.

Referring to FIG. 3, the phase interpolator 152 is a typical phase interpolator. Accordingly, since the phase interpolator 152 is generally known to those skilled in the art, details of the phase interpolator 152 will only be described in brief.

The phase interpolator 152 includes first and second pairs of differential transistors N1, N2, N4 and N5.

In more detail, the gates of the NMOS transistors N1 and N2 constituting the first pair of the differential transistors receive the pair of clocks 'clk' and 'clkb', and the gates of the NMOS transistors N4 and N5 constituting the second pair of the differential transistors receive the pair of the delayed clocks 'dly_clk' and 'dly_clkb'. A common source CN1 between the differential transistors N1 and N2 is grounded through an NMOS transistor N3, and output nodes n1 and n2 connected to drains of the first pair of the differential transistors N1 and N2, respectively, receive the external supply power VDD through resistors R1 and R2. A common source CN2 between the differential transistors N4 and N5 is grounded through an NMOS transistor N6, and drains of the second pair of the differential transistors N4 and N5 are connected to the output nodes n1 and n2, respectively.

Meanwhile, gates of the NMOS transistors N3 and N6 are connected to an NMOS transistor N7 in a current mirror type. Therefore, the NMOS transistors N3 and N6 apply a predetermined amount of current set by a constant current source CS1 to the first and second pairs of the differential transistors N1, N2, N4 and N5 as the same bias current.

Hereinafter, the operation of the first phase interpolator 152 will be described in detail.

The constant current source CS1 applies bias current to the first and second pairs of the differential transistors N1, N2, N4 and N5. The NMOS transistor N1 and the NMOS transistor N2 receive the positive clock 'clk' and the negative clock 'clkb' having a phase inverted to that of the positive clock 'clk'. When the positive clock 'clk' has a high level, the NMOS transistor N1 is turned on. Similarly, the NMOS transistors N4 and N5 receive the delayed positive clock 'dly_clk' and the delayed negative clocks 'dly_clkb'. Accordingly, when the delayed positive clock 'dly_clk' has a high level, the NMOS transistor N4 is turned on. Therefore, when a current path from the NMOS transistor N1 to the NMOS transistor N3, and a current path from the NMOS transistor N4 to the NMOS transistor N6 are formed, and current drivability is balanced between the NMOS transistors N4 and N6 by the constant current source CS1, the first preliminary clock 'pre-iclk' has a center phase of the phase of the positive clock 'clk' and the phase of the delayed positive clock 'dly_clk'. Similarly, the second preliminary clock 'pre-iclkb' having a center phase of the phase of the negative clock 'clkb' and the phase of the delayed negative clock 'dly_clkb' can be generated.

As described above, the first phase interpolator 152 can generate the first and second preliminary clocks pre-iclk and pre_iclkb having the center phases of input clock signals.

Meanwhile, since the second phase clock generator 200 (see FIG. 1) performs the same operation as that of the first phase clock generator 100 (see FIG. 1), details thereof will be omitted. In other words, similarly to the first phase clock generator 100 (see FIG. 1), the second phase clock generator 200 (see FIG. 1) can generate eight phase-interpolated clocks by using four input signals. For example, the second phase clock generator 200 (see FIG. 1) may generate a clock of 90° which is a center phase of 0° and 180°. In addition, the second phase clock generator 200 (see FIG. 1) may generate a clock of 45° by using phases of 0° and 180°. In such a manner, the second phase clock generator 200 (see FIG. 1) may receive the quad clocks 'iclk', 'iclkb', 'qclk' and 'qclkb' to generate the octal clocks 'clk<0>_8pg' to 'clk<7>_8pg' which are phase-interpolated by using the quad clocks 'iclk', 'iclkb', 'qclk' and 'qclkb'.

Figure 4:
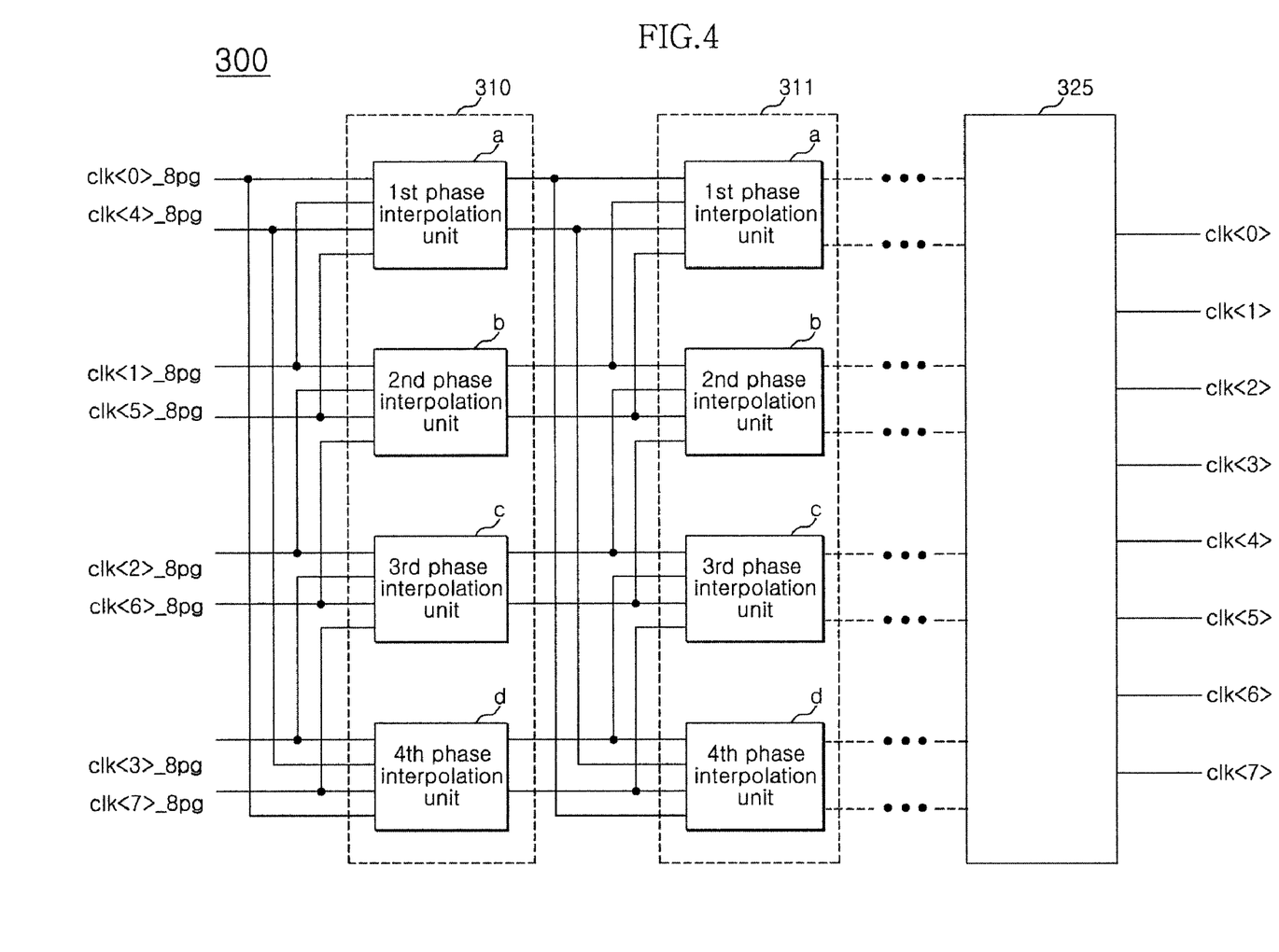
FIG. 4 is a view schematically showing a phase correction block shown in FIG. 1.

FIG. 4 is a view schematically showing the phase correction block 300 shown in FIG. 1.

Referring to FIG. 4, the phase correction block 300 includes a plurality of phase interpolation blocks, for example, 16 phase interpolation blocks 310 to 325. In this case, the number "16" is illustrative purpose only, and the present invention is not limited thereto. It is sufficient if the phase interpolation blocks 310 to 325 can correct a phase error.

The phase interpolation blocks 310 to 325 include first to fourth phase interpolation units a to d. The first to fourth phase interpolation units a to d generate clocks that are phase-interpolated between adjacent clocks. In order to avoid redundancy, only the first interpolation block 310 will be described in detail. For the purpose of explanation, 8-phase clocks of 0°, 45°, 90°, 135°, 180°, 225°, 270°, and 315° will be referred to as the first to eighth octal clocks 'clk<0>_8pg' to 'clk<7>_8pg', respectively.

The phase interpolation unit a of the first interpolation block 310 generates a clock that is phase-interpolated between the first octal clock 'clk<0>_8pg' and the second octal clock 'clk<1>_8pg', and generates a clock that is phase-interpolated between the fifth octal clock 'clk<4>_8pg' and the sixth octal clock 'clk<5>_8pg'.

The phase interpolation unit b generates a clock that is phase-interpolated between the second octal clock 'clk<1>_8pg' and the third octal clock 'clk<2>_8pg', and generates a clock that is phase-interpolated between the sixth octal clock 'clk<5>_8pg' and the seventh octal clock 'clk<6>_8pg'.

Similarly, the phase third and fourth interpolation units c and d generate clocks that are phase-interpolated between adjacent clocks.

In the same manner, the phase interpolation blocks 311 to 325 generate clocks that are phase-interpolated between adjacent clocks by using clock signals input from pre-stages.

As generally known to those skilled in the art, since a high-frequency signal is likely to have a frequency dependency, and therefore a clock skew may occur at each clock. Accordingly, multi-phase clocks generated based on clock signals having the clock skew cannot maintain a predetermined phase difference.

However, the phase correction block 300 according to one embodiment of the present invention is employed, so that phase-interpolated clocks are repeatedly generated several times until the multi-phase clocks 'clk<0>' to ' clk<7>' that are final output clocks are generated. As described above, whenever a new clock is generated through a phase interpolation scheme, phases are continuously changed, so that an error range of a phase difference is reduced to ½. Accordingly, when the phase correction block 300 employs 16 phase interpolation blocks to generate phase-interpolated clocks 16 times through the 16 phase interpolation blocks, a phase error range may be reduced to 1/32. Therefore, even if a phase error occurs between clocks, a phase error of the multi-phase clocks 'clk<0>' to ' clk<7>' that are final output clocks can be corrected. As a result, according to one embodiment of the present invention, clocks, which are phase-interpolated between adjacent phase clocks several times, are generated so that a phase error range is reduced. Accordingly, the multi-phase clocks 'clk<0>' to 'clk<7>' can be generated by correcting a phase error. Since the phase correction block 300 does not generate additional phase clocks, but performs phase correction, the phase correction is performed only for adjacent clocks to generate a clock having a center phase between the adjacent clocks.

Figure 5:
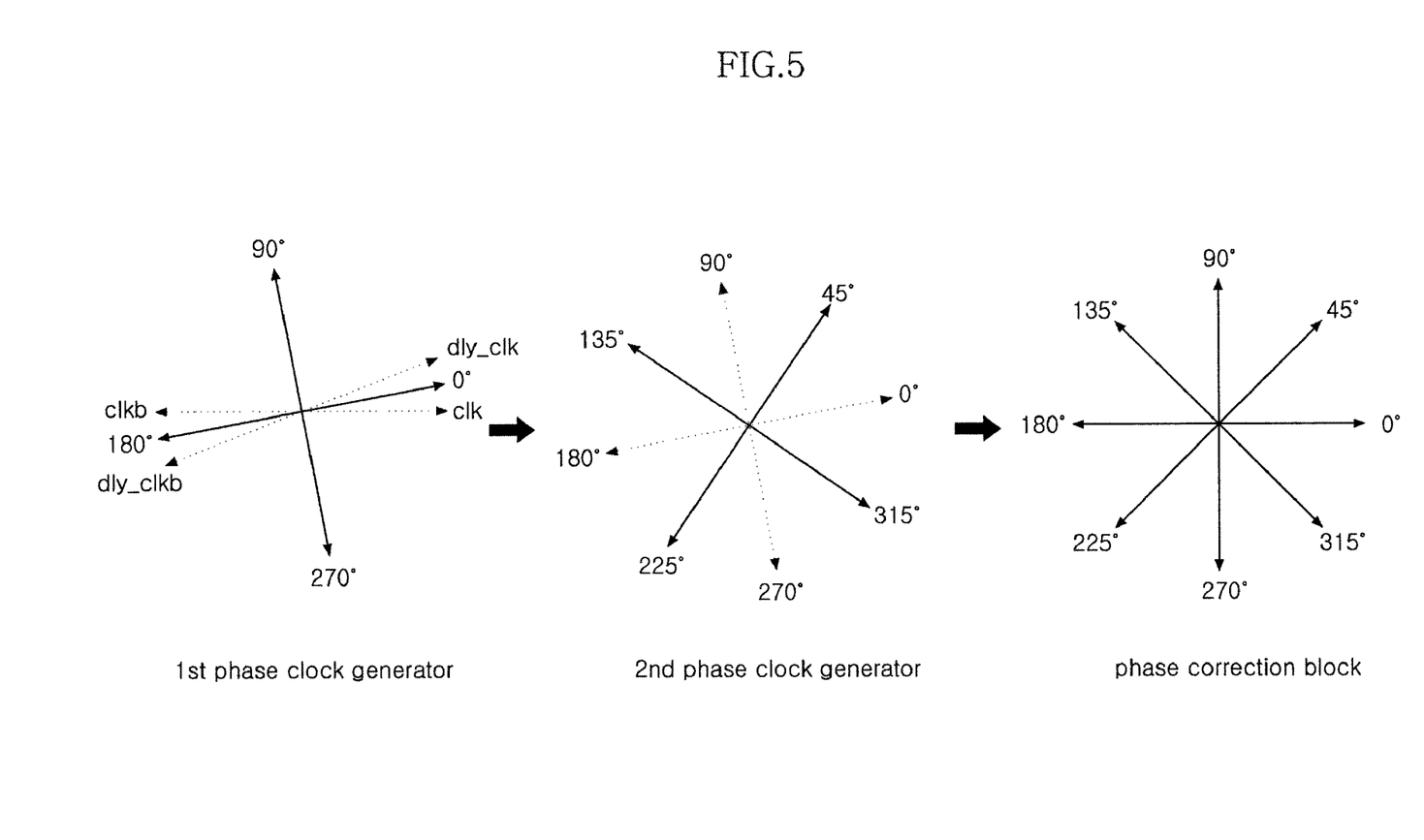
FIG. 5 is a phase diagram showing a phase relation of clocks of FIG. 1.

FIG. 5 is a phase diagram showing clock generation of FIG. 1.

Referring to FIG. 5, it can be noted that a clock of 0°, which is phase-interpolated between the delayed positive clock 'dly_clk' and the positive clock 'clk', is generated by the first phase clock generator 100 (see FIG. 1). In addition, a clock of 90°, which is phase-interpolated between the delayed positive clock 'dly_clk' and the negative clock 'clkb', is generated. Accordingly, clocks of 0°, 90°, 180°, and 270°, which are the quad clocks 'iclk', 'iclkb', 'qclk' and 'qclkb', are generated by the first phase clock generator 100.

In addition, clocks, which are phase-interpolated by using the clocks of 0°, 90°, 180°, and 270°, are additionally generated by the second phase clock generator 200 (see FIG. 1) to generate 8-phase clocks of 0°, 45°, 90°, 135°, 180°, 225°, 270°, and 315°.

Meanwhile, the phase correction block 300 (see FIG. 1) refines the 8-phase clocks of 0°, 45°, 90°, 135°, 180°, 225°, 270°, and 315° by performing a phase interpolation scheme n times. Accordingly, the phase correction block 300 can generate the multiple phase clocks 'clk<0>' to ' clk<7>', phases of which are corrected.

Figure 6:
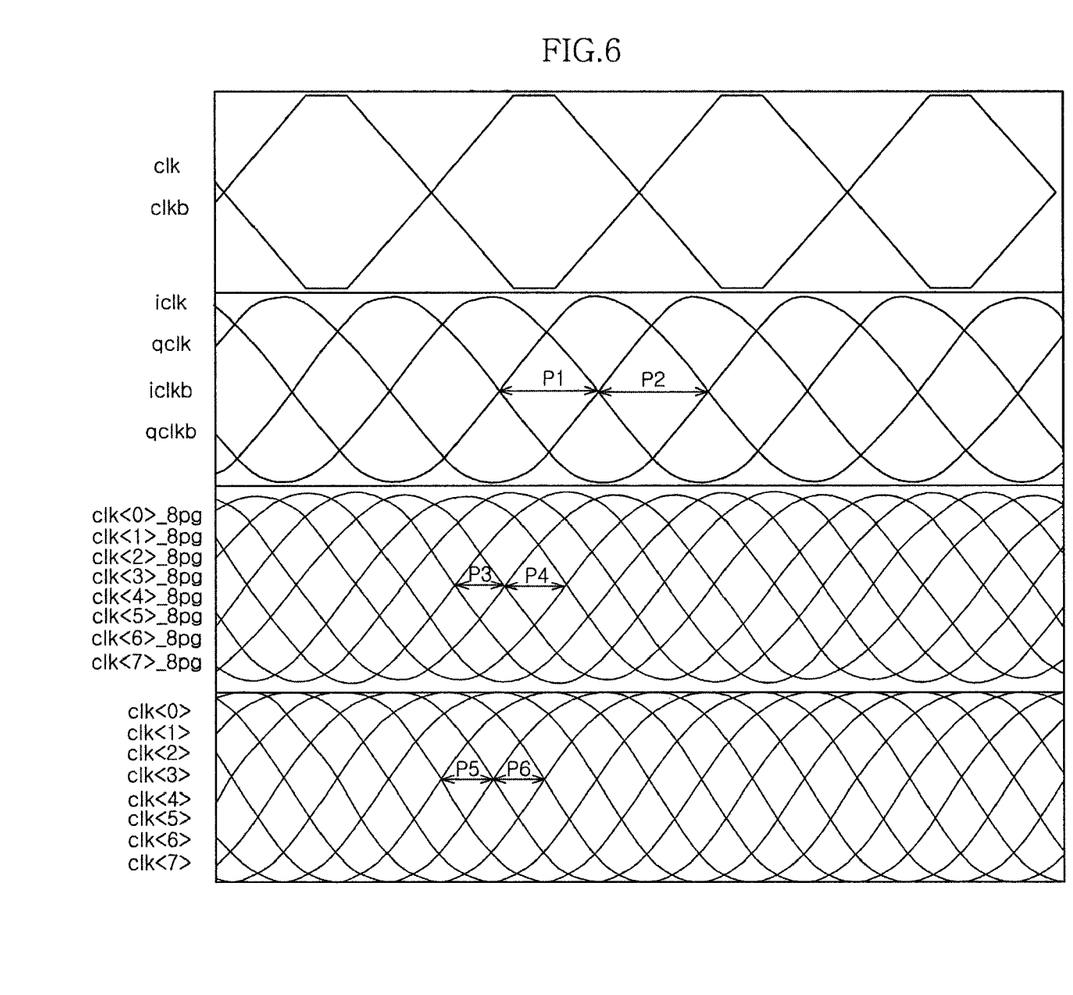
FIG. 6 is a view showing simulation waveforms representing a phase relation of clocks of FIG. 1.

FIG. 6 is a view showing simulation waveforms representing an experimental example of FIG. 1.

Referring to FIG. 6, the output clocks of the first phase clock generator 100 (see FIG. 1), the second phase clock generator 200 (see FIG. 1), and the phase correction block 300 (see FIG. 1) are shown as voltage waveforms.

Predetermined phase errors P1 and P2 occur among the output clocks of the first phase clock generator 100 (see FIG. 1), that is, the quad clocks 'iclk', 'iclkb', 'qclk' and 'qclkb'. In other words, it can be noted that phase differences between the quad clocks 'iclk', 'iclkb', 'qclk' and 'qclkb' are not uniform, but a difference is made between the phase differences (the phase error P2 is greater than the phase error P1).

Predetermined phase errors P3 and P4 occur among the output clocks of the second phase clock generator 200 (see FIG. 1), that is, the octal clocks clk<0>_8pg to clk<7>_8pg. In other words, it can be noted that phase differences between the octal clocks clk<0>_8pg to clk<7>_8pg are not uniform (the phase error P3 is greater than the phase error P4).

However, it can be noted that phases are corrected between the multi-phase clocks clk<0> to clk<7> so that phase differences between the multi-phase clocks clk<0> to clk<7> are uniform (a phase error P5 is actually equal to a phase error P6).

As described above, when clocks having multiple phases are generated, a plurality of phase interpolators are employed to repeatedly generate clocks having a center phase between adjacent clocks several times or more, so that phase errors between clocks can be corrected.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A multi-phase clock generation circuit comprising:
a phase clock generation block configured to generate a plurality of phase clocks having phases different from each other in response to a pair of input clocks; and
a phase correction block having a plurality of phase interpolation blocks, configured to generate interpolated multi-phase clocks, each multi-phase clock having a center phase between adjacent multi-phase clocks,
wherein each phase interpolation block includes a plurality of phase interpolation units configured to generate the interpolated multi-phase clocks having the center phase by using other multi-phase clocks that have adjacent phases.

2. The multi-phase clock generation circuit of claim 1, wherein a number of the phase clocks of the phase clock generation block is identical to a number of the multi-phase clocks.

3. A multi-phase clock generation circuit comprising:
a phase clock generation block configured to generate 4n (n is equal to or greater than 2) multiple phase clocks having different phases in response to n input clock signals having phases inverted relative to each other; and a phase correction block configured to generate final output 4n multiple phase clocks by repeatedly generating interpolated the multiple phase clocks m times (m is a natural number) based on the 4n multiple phase clocks which have phase differences adjacent to each other, wherein the phase correction block includes m phase interpolation blocks and is configured to generate the 4n multiple phase clocks by generating updated 4n multiple phase clocks having interpolated phases m times using the m phase interpolation blocks based on older 4n multiple phase clocks, and wherein the m phase interpolation blocks are connected to each other in series to continuously change phases of the 4n multiple phase clocks by allowing the 4n multiple phase clocks to sequentially pass through the m phase interpolation blocks.

4. The multi-phase clock generation circuit of claim 3, wherein each of the m phase interpolation blocks is configured to generate and interpolate multiple phase clocks between two adjacent multiple phase clocks by using multiple phase clocks input from a pre-stage.

5. The multi-phase clock generation circuit of claim 3, wherein each of the m phase interpolation blocks includes four phase interpolation units configured to receive n adjacent clocks.

6. A multi-phase clock generation circuit comprising:

a first phase clock generation block configured to generate quad clocks having different phases in response to a first pair of input clocks having phases inverted to each other;

a second phase clock generation block configured to generate octal clocks having different phases in response to the quad clocks; and a phase correction block configured to generate final multiple phase clocks having a number identical to a number of the octal clocks by generating interpolated the octal clocks m (m is a natural number) times, the interpolated octal clocks having a center phase based on other interpolated octal clocks which have adjacent phases wherein the phase correction block includes m phase interpolation blocks, and is configured to generate the final multiple phase clocks by generating the interpolated octal clocks m times using the m phase interpolation blocks based on other interpolated octal clocks, and wherein the m phase interpolation blocks are connected to each other in series to change phases of the interpolated octal clocks by allowing the interpolated octal clocks to sequentially pass through the m phase interpolation blocks.

7. The multi-phase clock generation circuit of claim 6, wherein each of the m phase interpolation blocks is configured to generate a corresponding interpolated octal clock, which is phase-interpolated between two adjacent interpolated octal clocks, by using the interpolated octal clocks input from a pre-stage.

8. The multi-phase clock generation circuit of claim 6, wherein each of the m phase interpolation blocks includes four phase interpolation units configured to receive two adjacent interpolated octal clocks.

9. The multi-phase clock generation circuit of claim 6, wherein the first phase clock generation block is configured to generate the quad clocks in response to a second pair of input clocks delayed from the first pair of input clocks by a predetermined time.

10. The multi-phase clock generation circuit of claim 9, wherein the first phase clock generation block is configured to generate the quad clocks having phase difference of $\pi/2$.

11. The multi-phase clock generation circuit of claim 6, wherein the second phase clock generation block is configured to generate the octal clocks having a center phase based on the quad clocks in response to the quad clocks.

12. The multi-phase clock generation circuit of claim 11, wherein the second phase clock generation block is configured to generate the octal clocks having a phase difference of $\pi/4$.

* * * * *